(12) United States Patent
Chun

(10) Patent No.: US 7,916,565 B2
(45) Date of Patent: Mar. 29, 2011

(54) SEMICONDUCTOR MEMORY DEVICE HAVING TEST CIRCUIT

(75) Inventor: Jun-Hyun Chun, Ichon (KR)

(73) Assignee: Hynix Semiconductor Inc. (KR)

( * ) Notice: Subject to any disclaimer, the term of this patent is extended or adjusted under 35 U.S.C. 154(b) by 330 days.

(21) Appl. No.: 12/172,949

(22) Filed: Jul. 14, 2008

(65) Prior Publication Data

US 2009/0122625 A1    May 14, 2009

(30) Foreign Application Priority Data

Nov. 9, 2007    (KR) .................. 10-2007-0114126

(51) Int. Cl.
*G11C 7/00*    (2006.01)
(52) U.S. Cl. ............... 365/201; 365/189.05; 365/203
(58) Field of Classification Search .............. 365/201, 365/189.05, 230.03, 203
See application file for complete search history.

(56) References Cited

U.S. PATENT DOCUMENTS

| 6,046,948 | A * | 4/2000 | Zheng et al. .................. 365/203 |
| 6,166,997 | A | 12/2000 | Dussault et al. |
| 6,636,998 | B1 | 10/2003 | Lee et al. |
| 7,120,070 | B2 | 10/2006 | Versen et al. |
| 2007/0147147 | A1 * | 6/2007 | Hirabayashi .................. 365/201 |

FOREIGN PATENT DOCUMENTS

| JP | 2003-066092 | 3/2003 |
| JP | 2007-179593 | 7/2007 |
| KR | 1020000034921 | 6/2000 |
| KR | 1020050047911 | 5/2005 |
| KR | 1020060008145 | 1/2006 |

* cited by examiner

*Primary Examiner* — Son Dinh
(74) *Attorney, Agent, or Firm* — Baker & McKenzie LLP

(57) ABSTRACT

A semiconductor memory device including a test circuit capable of reducing test time includes a test circuit for generating leakage current in the semiconductor memory device in a standby state in response to a test mode signal and a standby signal that provides standby state information of the semiconductor memory device.

18 Claims, 5 Drawing Sheets

SEMICONDUCTOR MEMORY DEVICE HAVING TEST CIRCUIT

CROSS-REFERENCES TO RELATED APPLICATION

This application claims the benefit under 35 U.S.C 119(a) of Korean application number 10-2007-0114126, filed on Nov. 9, 2007, which is incorporated herein in its entirety by reference as if set forth in full.

BACKGROUND

1. Technical Field

The embodiments described herein relate to a semiconductor memory device and, more particularly, to a test circuit for a semiconductor memory device.

2. Related Art

In general, after manufacturing, a semiconductor memory device is tested for normal operation by using a predetermined test apparatus to distinguish a good die and a bad die. In order to verify the semiconductor memory device, a test process is performed in which data provided from a tester is written in a memory cell and then the written data is read back for verification.

FIG. 1 is a schematic block diagram illustrating a relation between a conventional semiconductor memory device and a tester. Referring to FIG. 1, power lines are connected between the semiconductor memory device 1 and the tester 2 to provide external supply voltage VDD and ground voltage VSS such that write and read operations can be performed therebetween. However, power noise may occur in the external supply voltage VDD of the semiconductor memory device 1 due to undesired parasitic resistance R, inductance L and capacitance C components of the power lines and power supply characteristics of the tester 2.

Thus, when the semiconductor memory device 1 does not operate, current consumption is small and the power supply is in a standby state. However, if the semiconductor memory device 1 starts a write or read operation, then current consumption is increased. Therefore, sudden fluctuation in a level of the external supply voltage VDD may be caused by the R, L and C components of the power lines and response characteristics of the tester 2. Since a power level from the tester 2 is unstable during the initial write or read operation of the semiconductor memory device 1, the test for writing and reading is performed after the power level has been stabilized, that is, after a write or read operation, which is not reflected in a test result, has been performed for a predetermined dummy cycle. For this reason, the testing time of a semiconductor memory device is increased.

SUMMARY

A semiconductor memory device including a test circuit capable of reducing test time is described herein.

In one aspect, a semiconductor memory device can include a test circuit configured to generate leakage current in the semiconductor memory device in a standby state in response to a test mode signal, and a standby signal that provides standby state information of the semiconductor memory device.

In another aspect, a semiconductor memory device can includes a test circuit configured to generate leakage current having a level equal to a level of operating current of the semiconductor memory device in a state in which a test mode is activated and the semiconductor memory device is in a standby state.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

A test circuit according to one embodiment can allow positive leakage current, which can correspond to the operating current flowing when a write or read operation is performed, to flow in a standby state of a semiconductor memory device. Thus, although an operation mode can be switched from a standby mode to a write or read mode, the amount of electric current can be constant, so that voltage can be prevented from sudden fluctuations.

Figure 1:
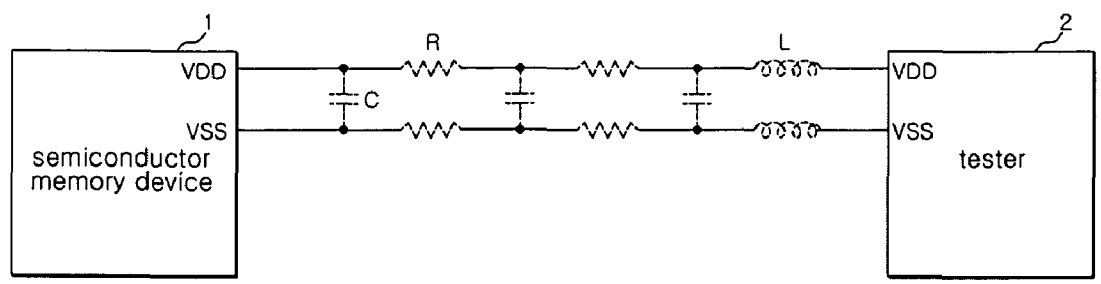
FIG. 1 is a schematic block diagram illustrating a relation between a conventional semiconductor memory device and a tester.
Figure 2:
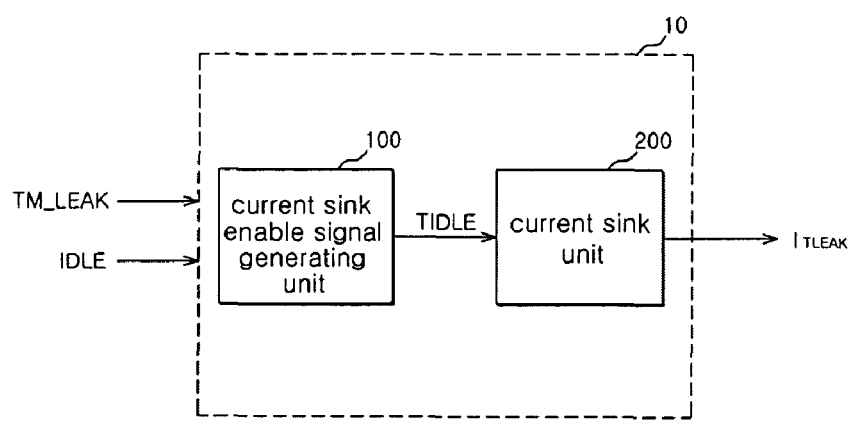
FIG. 2 is a block diagram illustrating a test circuit according to one embodiment.

FIG. 2 is a block diagram illustrating a test circuit according to one embodiment described herein. Referring to FIG. 2, the test circuit 10 can receive a test mode signal "TM_LEAK" and a standby signal "IDLE" and generate leakage current $I_{TLEAK}$ in a standby state of a semiconductor memory device. Such a test circuit 10 can include a current sink enable signal generating unit 100 and a current sink unit 200. The test mode signal "TM_LEAK" can include a random test mode signal which can be activated when the leakage current $I_{TLEAK}$ flows in a test mode. The test mode signal "TM_LEAK" can include a signal provided from e.g. an MRS (mode register set) or a TMRS (test mode register set). As the test circuit 10 receives the activated test mode signal "TM_LEAK" and standby signal "IDLE", the test circuit 10 can generate the leakage current $I_{TLEAK}$ even when the semiconductor memory device is in a standby state.

Conventionally, if an operation mode of a semiconductor memory device is suddenly changed from a standby mode to a write or read mode, then sudden fluctuation may occur in the voltage provided by a power supply of a tester due to increase in current difference between two modes. However, the test circuit 10, according to one embodiment, can allow positive leakage current $I_{TLEAK}$, which can corresponds to the operating current flowing when a write or read operation is performed, to flow in the standby state of the semiconductor memory device. Thus, although the operation mode is switched from the standby mode to the write or read mode, the current difference between the two modes is minimized such that voltage of the tester can be prevented from sudden fluctuations.

Figure 3:
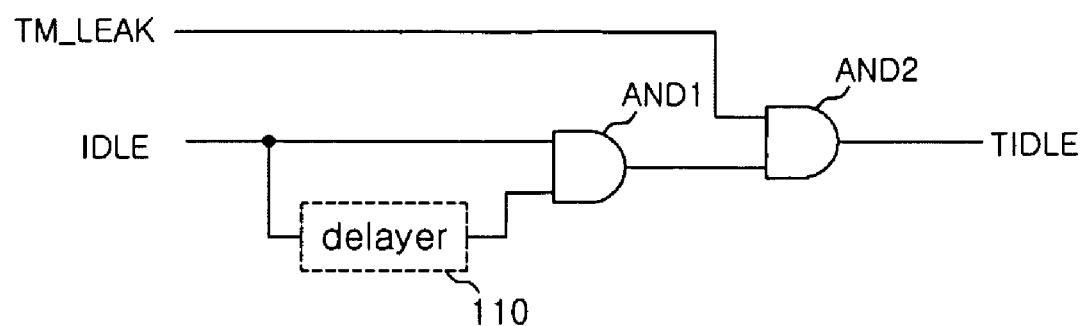
FIG. 3 is a circuit diagram illustrating a current sink enable signal generating unit that can be included in the circuit illustrated in FIG. 2.

FIG. 3 is a circuit diagram illustrating the current sink enable signal generating unit 100. Referring to FIG. 3, the current sink enable signal generating unit 100 can include a delayer 110 and first and second AND gates AND1 and AND2.

The current sink enable signal generating unit 100 can receive the test mode signal "TM_LEAK" and the standby signal "IDLE" to generate a current sink enable signal "TIDLE". In detail, if the test mode signal "TM_LEAK" and the standby signal "IDLE" are activated, then the current sink enable signal generating unit 100 can generate the current sink enable signal "TIDLE".

The first AND gate AND1 can receives the standby signal "IDLE" and a delayed standby signal. The second AND gate AND2 can receive the test mode signal "TM_LEAK" and an output signal of the first AND gate AND1, thereby generating the current sink enable signal "TIDLE" by performing an AND operation on the test mode signal "TM_LEAK" and the output signal. The delayer 110 can include a plurality of delay devices (not shown). If a predetermined time lapses after the operation mode of the semiconductor memory device is switched from the write or read mode to the standby mode, then the delayer 110 can generate the current sink enable signal "TIDLE". Thus, the number of the delay devices constituting the delayer 110 must be determined by considering the timing requirements such that a stable operation can be ensured during the mode switching.

Figure 4:
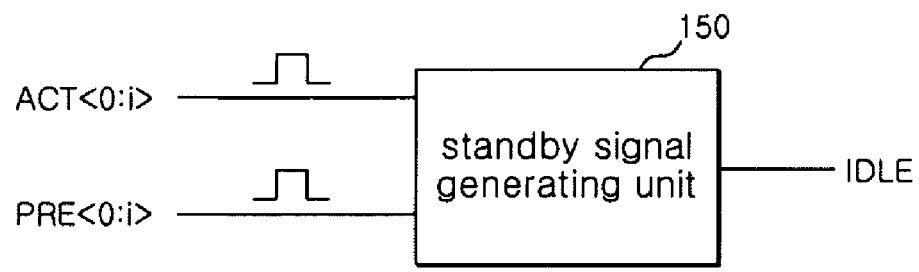
FIGS. 4 and 5 are schematic block diagram and detailed circuit diagram illustrating a standby signal generating unit.
Figure 5:
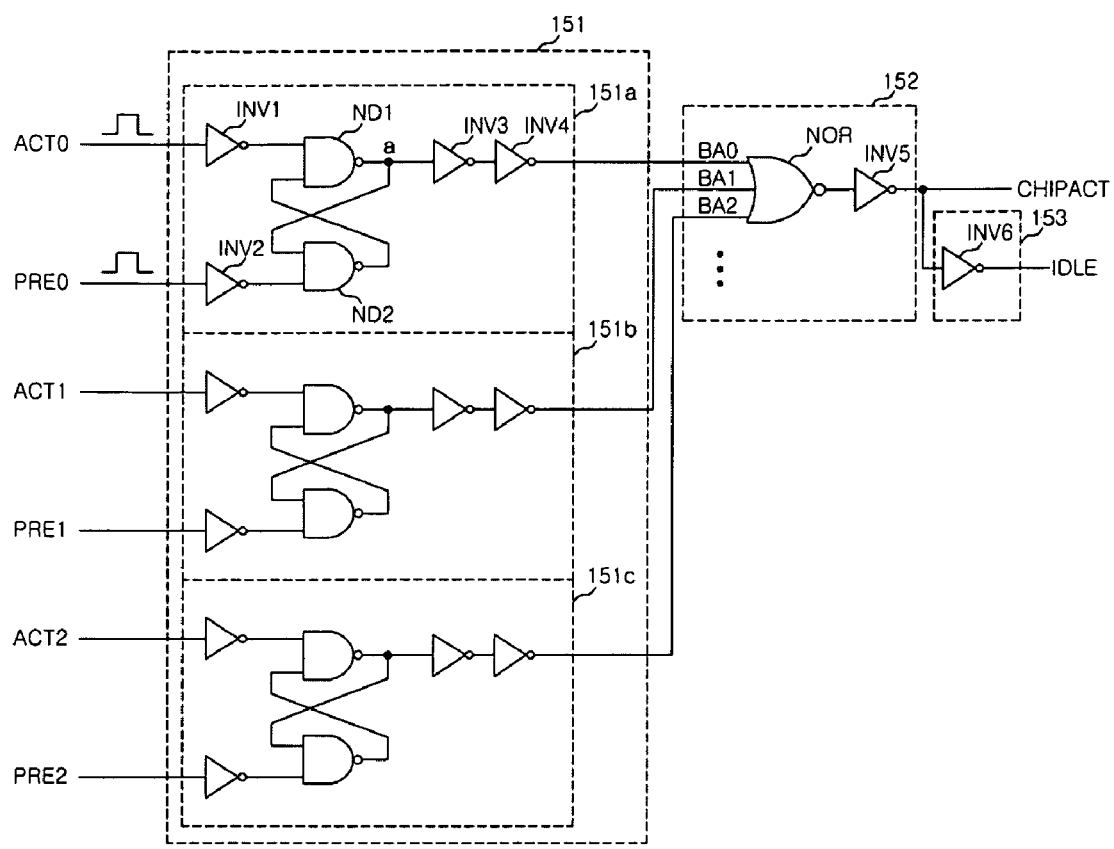

The generation of the standby signal "IDLE", which can provide information on the standby mode of the semiconductor memory device, will be described with reference to FIG. 4. FIGS. 4 and 5 are schematic block diagram and detailed circuit diagram illustrating a standby signal generating unit 150, respectively. Referring to FIGS. 4 and 5, the standby signal generating unit 150 can receive plural active signals "ACT<0:i>", which can be active signals for each bank, and plural precharge signals "PRE<0:i>" that can be precharge signals for each bank. In detail, the standby signal generating unit 150 can generate the standby signal "IDLE" which is deactivated in response to the active signals "ACT<0:i>", and then can be activated in response to the precharge signals "PRE<0:i>".

More specifically, the standby signal generating unit 150 can include a plurality of bank active signal generators 151a, 151b and 151c, a bank active signal combiner 152, and an inverter 153. The bank active signal generators 151a, 151b and 151c can correspond to each bank.

First, the first bank active signal generator 151a can include first to fourth inverters INV1 to INV4 and first and second NAND gates ND1 and ND2. The first NAND gate ND1 can receive an active signal "ACT0" of a bank 0, which can be inverted by the first inverter INV1, and can receive an output signal of the second NAND gate ND2, and then can perform a NAND operation on the active signal "ACT0" and the output signal. Such a first NAND gate ND1 can be triggered at a rising edge of the active signal "ACT0" of the bank 0 and can invert a signal level of a node "a". The second NAND gate ND2 can receive a precharge signal "PRE0" of the inverted bank 0 and a signal of the node "a", and then can perform a NAND operation on the precharge signal "PRE0" and the signal of the node "a". Such a second NAND gate ND2 can be triggered at a rising edge of the precharge signal "PRE0" of the bank 0 and can invert the output signal of the second NAND gate ND2.

In more detail, the first bank active signal generator 151a can provide a first bank active signal "BA0" that can represent whether the bank 0is in an active state based on the received active signal ACT0 and precharge signal PRE0 of the bank 0. The bank active signal generators 151a, 151b and 151c provided corresponding to each bank can have the same construction and operation principle, but can output different bank active signals according to signals received.

The bank active signal combiner 152 can include a NOR gate NOR and a fifth inverter INV5. The NOR gate NOR can output a low level if an activated bank active signal BA0, BA1 or BA2 is received. The fifth inverter INV5 can receive an output signal of the NOR gate NOR to invert the received output signal. In detail, the bank active signal combiner 152 can combine the bank active signals BA0, BA1 and BA2 to provide a chip active signal "CHIPACT" that can represent if the semiconductor memory device is in an active state.

The inverter 153 can receive an output signal of the bank active signal combiner 152, and can provide the standby signal "IDLE" by inverting the chip active signal "CHIPACT". The inverter 153 can include a sixth inverter INV6. In further detail, if an activated chip active signal "CHIPACT" is received, then the inverter 153 can provide a deactivated standby signal "IDLE". However, if a deactivated chip active signal "CHIPACT" is received, then the inverter 153 can provide an activated standby signal "IDLE".

Referring to FIG. 5, in one embodiment, if the first bank active signal generator 151a receives the activated active signal "ACT0" configured to activate a cell (not shown) provided in the bank 0, then the level of the node "a" can become a high level via the first NAND gate ND1 that can receive a low level. The signal of the node "a" can pass through the third and fourth inverters INV3 and INV4, so that the activated bank 0 active signal BA0, having a high level, can be generated.

If the first bank active signal generator 151a receives the deactivated active signal "ACT0" and the activated precharge signal "PRE0", then the second NAND gate ND2 can output a high level in response to the activated precharge signal "PRE0". Since the first NAND gate ND1 can receive the deactivated active signal "ACT0" through a receiving terminal provided at one side thereof, the node "a" can become low according to an NAND operation of the first NAND gate ND1. Thus, the first bank active signal generator 151a can generate the deactivated bank 0 active signal "BA0" having a low level.

Thus, if one of the provided bank active signal generators 151a, 151b and 151c, which can correspond to each bank, provides the activated bank active signal "BA0", "BA1" or "BA2", then the standby signal generating unit 150 can provide the chip active signal "CHIPACT" with a high level via the NOR gate NOR and the fifth inverter INV5. Simultaneously, the standby signal generating unit 150 can provides the deactivated standby signal "IDLE" with a low level. Furthermore, if all of the bank active signal generators 151a, 151b and 151c generate the deactivated bank active signal "BA0", "BA1" and "BA2", then the standby signal generating unit 150 can provide the deactivated chip active signal "CHIPACT" with a low level via the NOR gate NOR and the fifth inverter INV5. Simultaneously, the standby signal generating unit 150 can generate the activated standby signal "IDLE" having a high level.

In further detail, the standby signal generating unit 150 can check if all banks are in active operation states. If the entire bank is activated, then the standby signal generating unit 150 can provide the deactivated standby signal "IDLE" in order to represent that the semiconductor memory device is in an active state. However, if all banks of the standby signal generating unit 150 are not in the active state and are switched into a precharge state by a precharge command, then the standby signal generating unit 150 can generate the activated standby signal "IDLE" in order to represent that the semiconductor memory device is in the standby mode. The standby signal "IDLE" generated as described above serves as a detection signal that represents that the chip is in the standby state, other than the active state.

Figure 6:
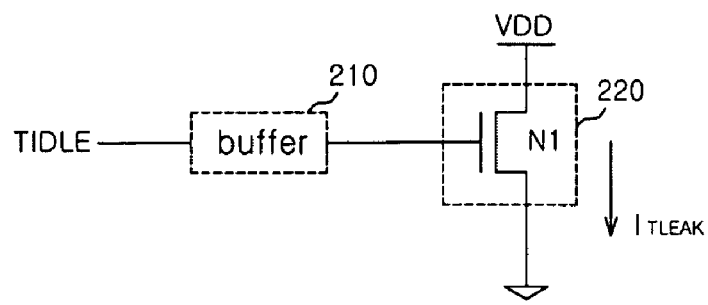
FIG. 6 is a circuit diagram illustrating a current sink unit that can be included in the circuit illustrated in FIG. 2.

FIG. 6 is a circuit diagram illustrating the current sink unit 200 of FIG. 2. If the activated current sink enable signal "TIDLE" is received, then the current sink unit 200 can sink electric current to generate the leakage current $I_{TLEAK}$. The current sink unit 200 can include a buffer 210 and a current driver 220. The buffer 210 can stabilize the current sink enable signal "TIDLE" by buffering the current sink enable signal "TIDLE". If the current sink enable signal "TIDLE" is a sufficiently stabilized signal, then the buffer 210 can be omitted. The current driver 220 can include a first NMOS transistor N1. The first NMOS transistor N1 can include a gate, which can receive the buffered current sink enable signal "TIDLE", a drain, to which the external supply voltage VDD can be applied, and a source that can receive the ground voltage VSS.

As the activated current sink enable signal "TIDLE" is received, the current sink unit 200 can turn on the first NMOS transistor N1. Thus, electric current can be sunk from the external supply voltage VDD to the ground voltage VSS so that a through-current can be applied to the current sink unit 200. The through-current can become the leakage current $I_{TLEAK}$ that flows in the standby state. The amount of the leakage current $I_{TLEAK}$ is substantially identical to that of operating current flowing when the semiconductor memory device performs a read or write operation. This can be achieved by sizing the width and length of the gate of the first NMOS transistor N1.

Figure 7:
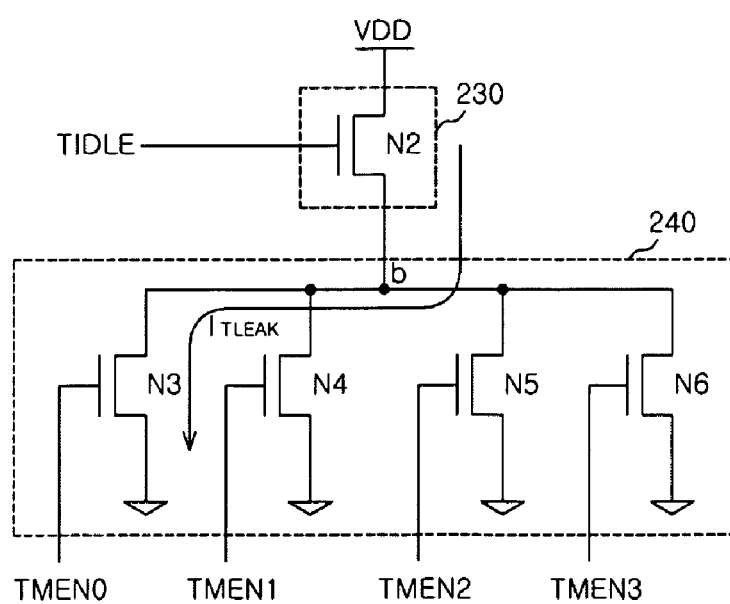
FIG. 7 is a circuit diagram illustrating a current sink unit according to another embodiment.

FIG. 7 is a circuit diagram illustrating the current sink unit 200 according to another embodiment. The current sink unit 200, according to another embodiment, can be refined to more finely adjust the amount of the leakage current $I_{TLEAK}$.

The current sink unit 200 can include a current controller 230 and a current adjustor 240. The current controller 230 can include a second NMOS transistor N2. The second NMOS transistor N2 can include a gate, which can receive the current sink enable signal "TIDLE", a source, to which the external supply voltage VDD is applied, and a drain connected with the current adjustor 240. The second NMOS transistor N2 can be turned on upon receiving the activated current sink enable signal "TIDLE".

The current adjustor 240 can include third to sixth NMOS transistors N3 to N6. The third to sixth NMOS transistors N3 to N6 can be arranged in parallel and can be turned on in response to first to fourth enable signals TMEN0 to TMEN3, respectively. In detail, the third to sixth NMOS transistors N3 to N6 can include gates which can receive the first to fourth enable signals "TMEN0" to "TMEN3", drains which can be connected with a common node "b", and sources which can receive the ground voltage VSS. For convenience of description, the first to fourth enable signals "TMEN0" to "TMEN3" will be referred to as the first to fourth enable signals "TMEN0" to "TMEN3" activated by combination of codes in a specific test mode. However, the scope of descriptions herein is not limited thereto. Various enable signals can be adopted as the first to fourth enable signals if they can turn on the third to sixth NMOS transistors N3 to N6, respectively.

Referring to FIG. 7, in another embodiment, the current sink unit 200 can be ready to apply electric current upon receiving the current sink enable signal TIDLE. The amount of the leakage current $I_{TLEAK}$ must be substantially identical to that of the operating current as described above. The third to sixth NMOS transistors N3 to N6 of the current adjustor 240 can be turned on, respectively, such that the amount of electric current can be finely adjusted. In detail, as the number of transistors turned on by the first to fourth enable signals "TMEN0" to "TMEN3" is increased, the amount of the leakage current $I_{TLEAK}$ can be finely increased. Thus, the desired amount of the leakage current $I_{TLEAK}$ can be obtained by controlling the turn-on operation of the transistors.

Figure 8:
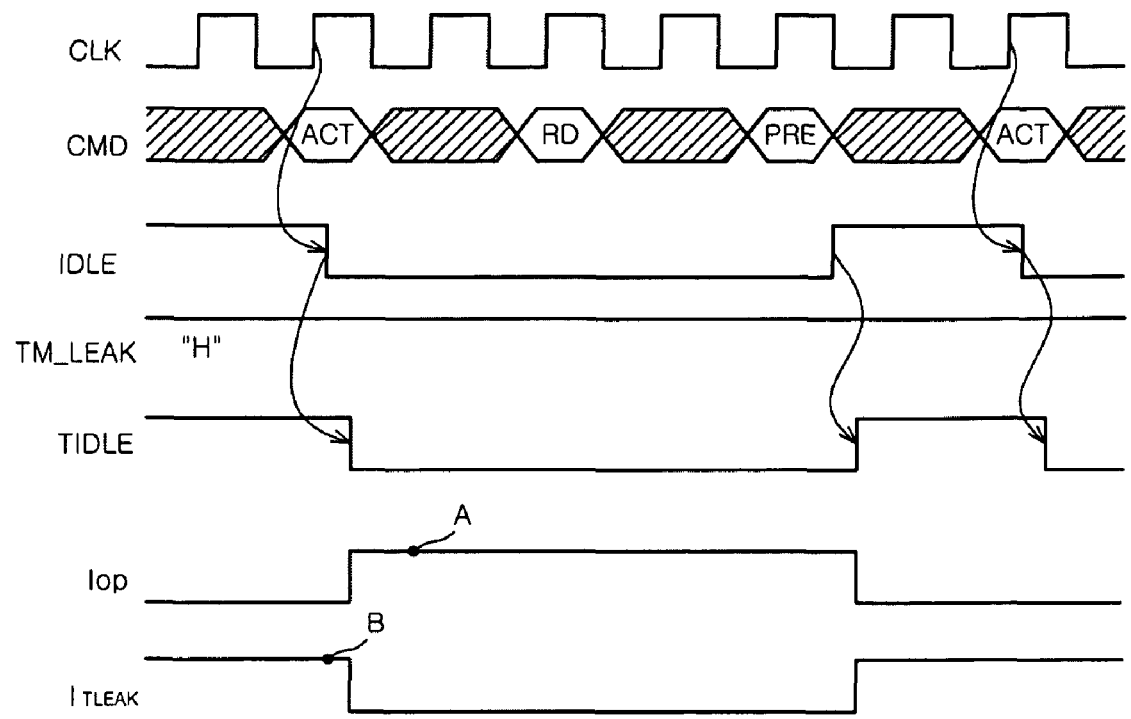
FIG. 8 is a time chart illustrating the operation of the test circuit that can be included in the circuit illustrated in FIG. 2.

FIG. 8 is a time chart illustrating the operation of the test circuit shown in FIG. 2. Referring to FIGS. 2 to 8, if an active command "ACT" is input, then the standby signal "IDLE" can be deactivated because the semiconductor memory device is in an active state. The current sink enable signal "TIDLE" can be deactivated in response to the deactivated standby signal "IDLE". At this time, if the semiconductor memory device is in an operation state, then the amount of operating current $I_{OP}$ can corresponds to "A" shown in FIG. 8.

If a precharge command PRE is input, then the activated standby signal IDLE can be generated. The current sink enable signal "TIDLE" can be activated in response to the activated standby signal "IDLE". At this time, if the semiconductor memory device is in a standby state, then the amount of the leakage current $I_{TLEAK}$ can correspond to "B" shown in FIG. 8. The amount A of the operating current $I_{OP}$ can be substantially identical to the amount B of the leakage current $I_{TLEAK}$.

In the test mode, the leakage current can flow by the amount of the operating current of the semiconductor memory device when the semiconductor memory device is in the standby state. Thus, although a mode of the semiconductor memory device can be switched from the standby mode to the operation mode, voltage can be prevented from being unstable due to big differences between electric current and parasitic components of the power lines, and the voltage can be stably supplied. Consequently, test time can be reduced since the test operation is instantly performed, rather than performing the test operation after test voltage has stabilized.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A semiconductor memory device comprising a test circuit configured to generate a leakage current in the semiconductor memory device in a standby state in response to a test mode signal and a standby signal that provides standby state information of the semiconductor memory device, wherein the test circuit comprises:
   a current sink enable signal generating unit configured to receive the test mode signal and the standby signal and generate a current sink enable signal; and
   a current sink unit coupled to the current sink enable signal generating unit, the current sink unit configured to generate the leakage current by sinking electric current in response to the activated current sink enable signal.

2. The semiconductor memory device of claim 1, wherein the current sink enable signal generating unit is configured to generate the current sink enable signal in response to the activated test mode signal and the activated standby signal.

3. The semiconductor memory device of claim 1, wherein the current sink unit is configured to allow through-current to flow by sinking the current from an external supply voltage to a ground voltage in response to the activated current sink enable signal.

4. The semiconductor memory device of claim 1, wherein the current sink unit comprises:
   a buffer for buffering the current sink enable signal; and
   a current driver coupled to the buffer, the current driver configured to drive a through-current in response to an output signal of the buffer.

5. The semiconductor memory device of claim 1, wherein the current sink unit comprises:
   a current controller configured to activate in response to the activated current sink enable signal; and
   a current adjustor coupled to the current controller, the current adjustor comprising a plurality of driving devices connected with an output terminal of the current controller, and the current adjustor configured to adjust the amount of the leakage current in proportion to a number of turned-on driving devices.

6. The semiconductor memory device of claim 1, further comprising a standby signal generating unit, wherein the standby signal generating unit comprises:
   a plurality of bank active signal generators each corresponding to a bank, the bank active signal generator configured to provide a activated bank active signal in response to an active command;
   a bank active signal combiner coupled to the plurality of bank active signal generators, the bank active signal combiner configured to combine the bank active signal of each bank and provide a chip active signal, the chip active signal configured to represent active state information of the semiconductor memory device; and
   an inverter coupled to the bank active signal combiner, the inverter configured to provide the standby signal by inverting the chip active signal.

7. The semiconductor memory device of claim 6, wherein each bank active signal generator is configured to receive an active signal and a precharge signal, provide the activated bank active signal of a corresponding bank in response to the activated active signal, and provide the bank active signal of a corresponding bank in response to the precharge signal.

8. The semiconductor memory device of claim 6, wherein the bank active signal combiner is configured to provide an output signal of a first level upon receiving the activated bank active signal from at least one of the plurality of bank active signal generators, and provide an output signal of a second level upon receiving a deactivated bank active signals from each of the plurality of bank active signal generators.

9. The semiconductor memory device of claim 8, wherein the inverter is configured to receive the output signal of the first level, invert the output signal of the first level, and output the deactivated standby signal of the second level, and receive the output signal of the second level, invert the output signal of the second level, and provide the activated standby signal of the first level.

10. A semiconductor memory device comprising: a test circuit configured to generate leakage current equal to an operating current of the semiconductor memory device in active state, when a test mode is activated and the semiconductor memory device is in a standby state, wherein the test circuit comprises:
   a current sink enable signal generating unit configured to receive the test mode signal and the standby signal and generate a current sink enable signal; and
   a current sink unit coupled to the current sink enable signal generating unit, the current sink unit configured to generate the leakage current by sinking electric current in response to the activated current sink enable signal.

11. The semiconductor memory device of claim 10, wherein the current sink enable signal generating unit is configured to generate the current sink enable signal in response to the activated test mode signal and the activated standby signal.

12. The semiconductor memory device of claim 10, wherein the current sink unit is configured to allow through-current to flow by sinking the current from external supply voltage to ground voltage in response to the activated current sink enable signal.

13. The semiconductor memory device of claim 10, wherein the current sink unit comprises:
   a buffer configured to buffer the current sink enable signal; and
   a current driver coupled to the buffer, the current driver configured to drive a through-current in response to an output signal of the buffer.

14. The semiconductor memory device of claim 10, wherein the current sink unit comprises:
   a current controller configured to activate in response to the activated current sink enable signal; and
   a current adjustor coupled to the current controller, the current adjustor configured to include a plurality of driving devices connected with an output terminal of the current controller, and thereby adjust an amount of the leakage current in proportion to a number of turned-on driving devices.

15. The semiconductor memory device of claim 10, further comprising a standby signal generating unit, wherein the standby signal generating unit comprises:
   a plurality of bank active signal generators each corresponding to a bank, the bank active signal generator configured to provide an activated bank active signal in response to an active command;
   a bank active signal combiner coupled to the plurality of bank active signal generators, the bank active signal combiner configured to combine the bank active signal of each bank and provide a chip active signal, the chip active signal configured to represent active state information of the semiconductor memory device; and
   an inverter coupled to the bank active signal combiner, the inverter configured to provide the standby signal by inverting the chip active signal.

16. The semiconductor memory device of claim 15, wherein each bank active signal generator is configured to receive an active signal and a precharge signal, provide the activated bank active signal of a corresponding bank in response to the activated active signal, and provide the bank active signal of a corresponding bank in response to the precharge signal.

17. The semiconductor memory device of claim 15, wherein the bank active signal combiner is configured to provide an output signal of a first level upon receiving an activated bank active signal, and provides an output signal of a second level upon receiving deactivated bank active signals from each of the bank active signal generators.

18. The semiconductor memory device of claim 17, wherein the inverter is configured to receive the output signal of the first level, invert the output signal of the first level, and output the deactivated standby signal of the second level, and receive the output signal of the second level, invert the output signal of the second level, and provide the activated standby signal of the first level.

* * * * *